US010921771B2

(12) United States Patent
Bramberger

(10) Patent No.: US 10,921,771 B2
(45) Date of Patent: Feb. 16, 2021

(54) METHOD AND DEVICE FOR PLANNING AND/OR CONTROLLING AND/OR SIMULATING THE OPERATION OF A CONSTRUCTION MACHINE

(71) Applicant: Liebherr-Werk Biberach GmbH, Biberach an der Riß (DE)

(72) Inventor: Robert Bramberger, Mittelstetten (DE)

(73) Assignee: Liebherr-Werk Biberach GmbH, Biberach an der Riß (DE)

( * ) Notice: Subject to any disclaimer, the term of this patent is extended or adjusted under 35 U.S.C. 154(b) by 161 days.

(21) Appl. No.: 16/091,920

(22) PCT Filed: Apr. 6, 2017

(86) PCT No.: PCT/EP2017/000435
§ 371 (c)(1),
(2) Date: Oct. 5, 2018

(87) PCT Pub. No.: WO2017/174195
PCT Pub. Date: Oct. 12, 2017

(65) Prior Publication Data
US 2019/0094834 A1 Mar. 28, 2019

(30) Foreign Application Priority Data
Apr. 8, 2016 (DE) ...................... 10 2016 004 382.2

(51) Int. Cl.
*G05B 19/19* (2006.01)
*G06Q 50/08* (2012.01)
(Continued)

(52) U.S. Cl.
CPC ............. *G05B 19/19* (2013.01); *G06F 30/13* (2020.01); *G06Q 10/067* (2013.01);
(Continued)

(58) Field of Classification Search
None
See application file for complete search history.

(56) References Cited

U.S. PATENT DOCUMENTS 7,676,967 B2 3/2010 Gharsalli
8,014,982 B2 * 9/2011 Kang ...................... G09B 9/05
212/83

(Continued)

FOREIGN PATENT DOCUMENTS

DE 10 2006 059 829 A1 6/2008
JP 2006167009 * 12/2007

(Continued)

OTHER PUBLICATIONS

Al Hussein et al., "Integrating 3D visualization and simulation for tower crane operations on construction sites", 2006, Automation in Construction 15, pp. 554-562 (Year: 2006).*

(Continued)

*Primary Examiner* — Mohammad Ali
*Assistant Examiner* — David Earl Ogg
(74) *Attorney, Agent, or Firm* — Troutman Pepper Hamilton Sanders LLP; Ryan A. Schneider

(57) ABSTRACT

A method and a device for planning and/or controlling and/or simulating the operation of a construction machine, in particular in the form of a crane, using a structure data model which contains digital information on a structure to be erected and/or to be worked on. A construction machine which can be linked to such a structure data model and/or can be controlled using such a structure data model. A construction machine data model which contains digital information on different construction machine models is linked to the structure data model or the BIM, characteristics of the available construction machines are already taken into consideration during the planning process, a simulator for training construction machine tasks is configured using the (Continued)

Figure 1:
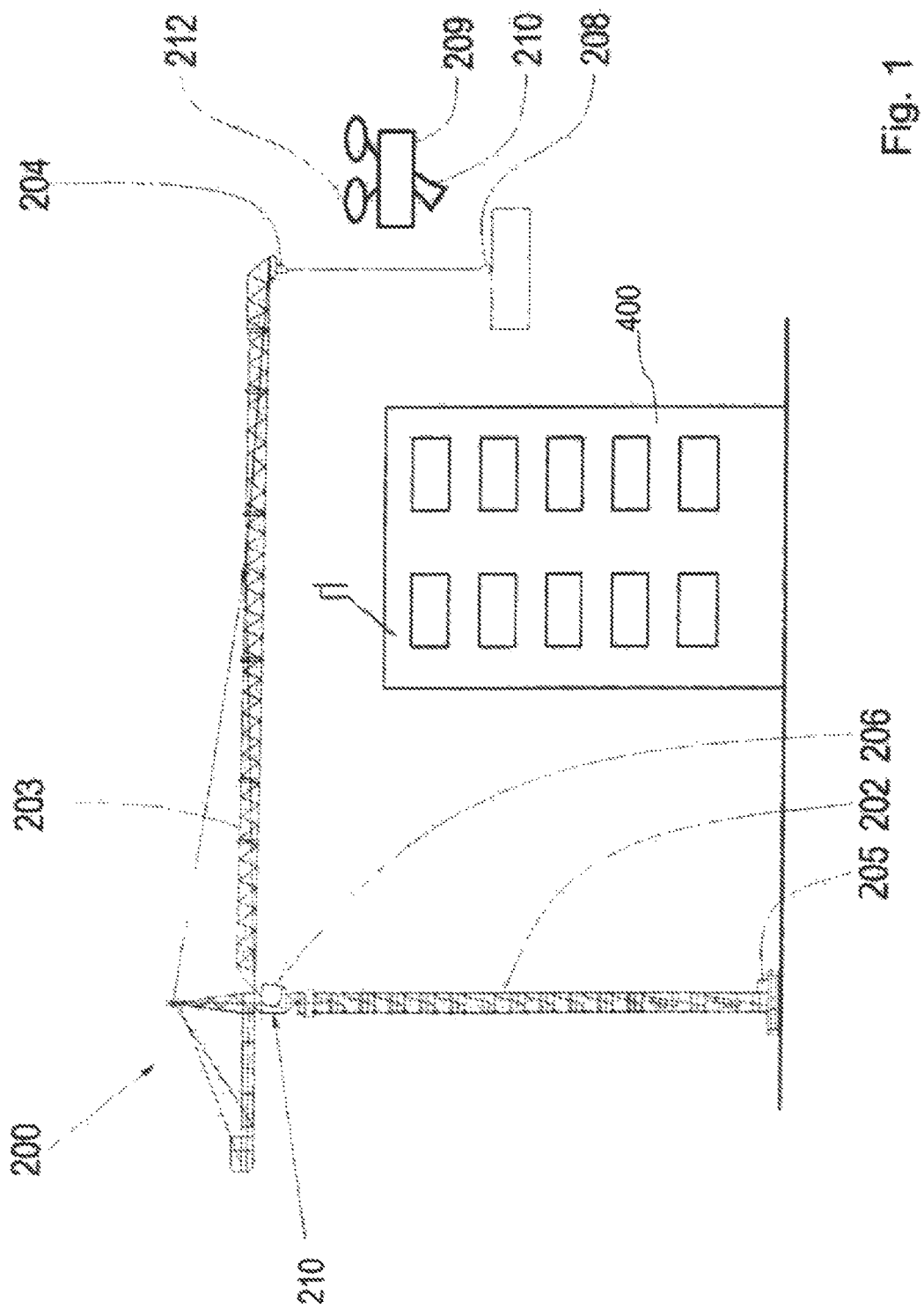

structure data model, and the controller of the construction machine is adapted to the structure data model with respect to specific control functions.

52 Claims, 2 Drawing Sheets

(51) Int. Cl.
  *G06Q 10/06*    (2012.01)
  *G09B 9/04*    (2006.01)
  *G09B 19/16*    (2006.01)
  *G06F 30/13*    (2020.01)

(52) U.S. Cl.
  CPC . *G06Q 10/06313* (2013.01); *G06Q 10/06315* (2013.01); *G06Q 50/08* (2013.01); *G09B 9/04* (2013.01); *G09B 19/167* (2013.01); *G05B 2219/31276* (2013.01)

(56) References Cited

U.S. PATENT DOCUMENTS

| | | |
|---|---|---|
| 8,843,311 B2 | 9/2014 | Takeda |
| 2012/0154572 A1* | 6/2012 | Stratton ................. G09B 9/048 348/114 |
| 2016/0107866 A1* | 4/2016 | Schoonmaker ......... B66C 13/46 701/50 |
| 2016/0321763 A1* | 11/2016 | Shike ............... G06Q 10/06313 |
| 2018/0374168 A1* | 12/2018 | Kano ..................... G06Q 50/08 |

FOREIGN PATENT DOCUMENTS

| | | |
|---|---|---|
| WO | 2013006625 A2 | 1/2013 |
| WO | 2016019158 A1 | 2/2016 |

OTHER PUBLICATIONS

Mikulakova et al., "Knowledge-based schedule generation and evaluation", 2010, Advanced Engineering Informatics 24, pp. 389-403 (Year: 2010).*

Marzouk, "Decision support for tower crane selection with building information models and genetic algorithms", 2015, Automation in Construction vol. 61, pp. 1-15 (Year: 2015).*

Teizer, "Status quo and open challenges in vision-based sensing and tracking of temporary resources on infrastructure construction sites", 2015, Advanced Engineering Informatics 29, pp. 225-238 (Year: 2015).*

International Search Report and Written Opinion for Related International Application No. PCT/EP2017/000435 dated Jun. 7, 2017, 11 pages.

Search Report for German Application No. 10 2016 004 382.2, dated Jan. 26, 2017, 12 pages.

Search Report and Office Action for Russian Application No. 2018138916/28 (064690), dated Jul. 29, 2020, 10 pages.

* cited by examiner

METHOD AND DEVICE FOR PLANNING AND/OR CONTROLLING AND/OR SIMULATING THE OPERATION OF A CONSTRUCTION MACHINE

The present invention relates to a method and to an apparatus for planning and/or controlling and/or simulating the operation of a construction machine, in particular in the form of a crane such as a revolving tower crane, using a structure data model that includes digital information on a structure to be erected and/or to be worked. The invention here also relates to the construction machine itself that can be linked to such a structure data model and/or that is controllable using such a structure data model. The invention finally also relates to a simulator and/or to a remote control for simulating and/or remote controlling a construction machine using such a structure data model.

In the more recent past, digital structure data models have been used for all the trades involved in the structure for the planning, erecting, working, and checking of structures. The method developed for this is known by the term building information modeling. Digital information on the structure to be erected and/or to be worked is included in this database called a BIM model. Such structure data models or BIM models are as rule computer readable files or file conglomerates and occasionally processing computer program modules for processing such files in which information and characteristics describe the structure to be erected or to be worked and its relevant properties in the form of digital data. Such structure data models can in particular include two-dimensional, three-dimensional, or multi-dimensional CAD data for the visualization of the structure and/or its construction site, but also other relevant information on the structure, for example its timetable for its erection, information on the surrounding infrastructure such as access roads, energy and water utilities, or logistical information on required auxiliary material for the erection or working of the structure. Structure parameters such as construction volume, structure height, dimensions of extent in elevation, material volumes such as the required volume of concrete, volume of bricks, et cetera. or construction element weights of individual structure components such as steel beams, fabricated construction elements, or similar are often included as characteristic structure data. The structure data model and its files or the file conglomerate is here frequently sendable and/or has network capability to be provided to different construction participants.

A number of processes in the erection of a structure are processed with the aid of a computer using such structure data models, with an architect preparing a draft in classical construction planning, for example, and drawing it with the aid of CAD systems, whereupon a quantity determination can be prepared for the cost calculation on the basis of the CAD drawings or the plans can be submitted to other professional engineers, fire safety inspectors, or authorities. If plan changes occur, the drawings are changed and coordinated with the participants, the quantity determination is adapted and the cost calculation is revised, which makes everything a lot simpler when using the integrated BIM model, and is partly automatically completed by software modules that can access the data of the structure data model.

It has already been proposed in this context to link data relating to the operation of a crane to a BIM or a structure data model. Document WO 2016/019158 A1, for example, describes a method by means of which a BIM model is updated by crane operating data, a timeline or a timetable being generated using the construction elements to be moved by the crane that includes the required crane deployments and is integrated in the data model of the BIM environment. The data model can then update further BIM functions with reference to the generated timeline.

Document WO 2013/006625 A1 further describes a method of maneuvering a crane within a construction site while making use of data from a BIM model, with, on the one hand, global 3D coordinates of the crane hook that are determined with the aid of absolute position sensors and, on the other hand, global 3D coordinates that characterize the structure to be erected and the position of the structure parts and are stored in the BIM are compared with one another.

As a result, the functional gain of the previously provided linking of a crane to the BIM model is, however, limited. To date, it has in particular not been possible to achieve any great advantages in the control of construction machinery such as cranes or excavators and their handling by BIM models.

It is therefore the underlying object of the present invention to provide an improved integration of construction machinery and their operation in structure data models and/or an improved link of construction machinery to such structure data models that avoid disadvantages of the prior art and advantageously further develop the latter. A more efficient and more secure control of construction machinery should in particular be achieved by an improved link to BIM models.

Said object is achieved in accordance with the invention by a method in accordance with claim 1, by an apparatus in accordance with claim 21, by a construction machine in accordance with claim 44, by a simulator in accordance with claim 49, by a remote control in accordance with claim 52, and by a software program product in accordance with claim 53. Preferred embodiments of the invention are the subject of the dependent claims.

It is therefore proposed in accordance with an aspect of the invention to link a machine data model in which digital information on different construction machine models is included to the structure data model or to the BIM model and to already take characteristics of the available construction machinery into account in the planning. Said machine data model can here be provided in the form of a software module or an app that has an interface for communication with the structure data model and that can, for example, be downloaded from a server or from a software store or that can also be stored on a data carrier.

An automatic selection of a construction machine suitable for the erection and/or working of the respective structure can take place in accordance with the invention by means of the machine data model with reference to digital information from the structure data model and from the machine data model, with an automatic identification and reading of relevant information from the structure data model taking place for this purpose with reference to criteria that are predefined by the machine data model and that relate to machine data in which the different construction machine models differ from one another. The automatic selection of the suitable construction machine then takes place with reference to an automatic comparison of the read information from the structure data model with the machine data of different construction machinery from the machine data model.

The modules implementing said functions can in particular be integrated in the form of software tools in the machine data model, but optionally also in the structure data module. On an integration into the linkable machine data model, the total functionality for the automatic selection of the matching construction machine can be provided by the downloadable and/or importable software tool that implements the machine data model and it is possible to this extent to work with a BIM or with a structure data model that for this purpose only requires a corresponding interface via which the supplementary software tool can be linked.

The relevant information from the structure data model that is required for the selection of the construction machine and that is identified and read by an identification and/or reading module can comprise different structure characteristics such as the structure height, the weight of the heaviest construction element to be moved, the area and/or the cross-sectional extent of the structure in elevation and/or the maximum distance between a construction element delivery station stored in the BIM and a construction element destination at which the respective construction element is to be installed. These identified and read structure characteristics can then be compared by a comparison module with relevant information from the machine data model, with the relevant machine information in particular being able to comprise the following information: machine lift height; maximum machine payload; and/or machine range. If, for example, a crane suitable for the structure is to be selected, a crane can be selected whose lift height is sufficient for the structure height whose payload is sufficient for the weight of the heaviest construction element to be moved and whose range is sufficient for the cross-sectional extent of the structure in elevation and/or the maximum distance between the construction element delivery station and the construction element destination. If a plurality of cranes are included in the machine data model that satisfy said criteria, the smallest crane can be selected that satisfies said demands and so-to-say has the smallest surplus with respect to the crane capacities.

In accordance with a further aspect of the present invention, the linking of the machine data model to the structure data model can also be utilized to automatically determine and/or to automatically check the installation site of the construction machine, in particular the position of the crane relative to the structure to be erected or to be worked. If a construction machine is selected, which can take place in the aforesaid manner in an automated fashion by the described selection module or alternatively also manually by the planner himself, a position determination module can automatically determine a suitable installation location for the construction machine with reference to relevant machine data that are read from the construction machine model and that can, for example, comprise the range and/or the lift height and/or the collision range and/or working range of the construction machine and with reference to relevant structure data that are read from the structure data model and can, for example, comprise structure dimensions and/or structure contours and/or construction site topographical data and/or access paths and/or material delivery stations. Alternatively or additionally, said position or installation location determination module can check a position of the construction machinery possibly manually fixed by the planner with respect to said criteria, in particular as to whether the range or the working location of the construction machine at the determined installation location is sufficient for the work to be carried out by the construction machine and/or whether collisions of the working range of the construction machine with structure contours and/or other topographic circumstances of the construction site such as trees or adjacent buildings occur in order then optionally to release the installation location of the construction machine or to propose an alternative installation location.

After a successful determination and/or check of the machine installation location, the BIM or the structure data model can be correspondingly updated by said installation location determination module with respect to the installation location.

In a further development of the invention, the installation location determination module can also automatically bound the working range of the respective selected construction machine automatically with reference to aforesaid collision check and can update the structure data model by the determined working range restrictions. As will still be explained, the construction machine control apparatus can be adapted or parameterized accordingly with respect to a working range boundary function.

Alternatively or additionally to such an automatic selection and/or check of the work position of the construction machine, a logistics module can automatically determine the order and/or the times of the delivery of parts of the selected construction machine and/or the transport units required for the delivery using digital information from the structure data model. Said logistics module can here likewise be integrated in the construction machine model in the form of a software tool and/or of a functional module, but can optionally also be linked to the structure data model as a separate module. So-called packing lists or transport lists can in particular be prepared in an automated manner by the logistics module with the aid of the data from the structure data model.

The order and/or the times of the delivery of parts can here be determined while taking account of the work to be carried out for the structure and/or of the progress and/or status of the structure that can be stored as digital information in the structure data model. In addition to said information from the structure data model, the logistics module can also take account of relevant information from the machine data model, in particular relevant information on the selected construction machine such as its dismantling capability and/or the weight of the machine components and/or the size of the machine components and/or the installation order of the machine components. If, for example, a crane is supplied, low loader units and/or container units can be selected and/or ordered in order in the matching size and/or matching rated capacity with whose aid the crane parts can be delivered in the matching order to the construction site at the matching time, optionally while taking account of the access roads present there.

In accordance with a further aspect of the present invention, a simulator is also linked to the structure data model to simulate the operation of a construction machine selected for the erection and/or working of the structure, with specific digital information from the structure data model being able to be used for the generation of the virtual reality of the simulator. The simulator can here have an interface for the linking of the structure data model, with an identification and/or reading module being able to be provided to read relevant structure characteristics such as structure contours, surrounding contours, or other construction machines used from the structure data model and to provide them to the generator for generating the virtual reality with reference to which the animation of the construction machine and/or of the construction machine surroundings can then be generated in which a machine operator can then train specific machine work.

In a further development of the invention, the linking of the BIM model or of the structure data model to the simulator can be used to be able to represent different states and construction phases of the structure to be erected and to be worked using the digital information from the structure data model on the display device of the simulator or to be able to display them as an animation with reference to which a construction machine operator can then train specific special work at the simulator such as special lifts of a crane. Machine data can also be provided and/or imported for the control of the simulator and/or for the generation of the virtual reality at the simulator that are provided by the aforesaid machine data model and that characterize the respectively selected construction machine to adapt the virtual reality at the simulator to the construction machine selected for the structure.

In a further development of the invention, a plurality of simulators can also be linked to the structure data model to simulate and train the interaction of a plurality of construction machines that are selected for the erection or working of the structure. Such a plurality of simulators can, on the one hand, obtain in the aforesaid manner digital information relating to the structure to generate the virtual reality with reference to the structure data from the structure data model, for example different construction phases and states of the structure to be erected. On the other hand, respective digital information from the machine data model can be imported or read in to be able to adapt the virtual representations at the simulators to the respectively used construction machines.

In an advantageous further development of the invention, the interaction of both simulators with one another is here coordinated by a higher ranking simulator control module, in particular such that machine actions initiated or performed at the one simulator such as crane lifts are displayed and/or taken into account at the respective other simulator. If, for example, a construction element is to be lifted and placed down at a specific location by means of two cranes together, crane movements carried out at the one simulator and construction element movements resulting therefrom can be displayed at the other simulator and can optionally also be displayed in the form of dynamic reactions. If, for example, the crane operator lowers the jointly lifted construction element a little abruptly at the one simulator, this also results in dynamic reactions at the other simulated crane that can then be reproduced in the form of dynamic reactions at the operator's cab of the other simulator.

Virtual representations of the one construction machine that take account of the control commands input at the associated simulator and of the movements resulting therefrom can in particular be displayed and animated at the display unit of the respective other simulator. The interaction and optionally also resulting collisions can hereby be trained jointly at a plurality of simulators.

To achieve a realistic simulation of the construction machine operation, provision can be made in a further development of the invention that machine reactions to control commands input at the control station, for example in the form of machine movements and/or machine deformations are not only represented in the form of a virtual representation on the display apparatus of the simulator, but are rather converted into an actual movement of the control station of the simulator that accompanies the crane reaction or machine reaction to communicate the dynamic machine reactions to the user and to allow him to experience them more realistically. The control station that can, for example, comprise an operator's seat is for this purpose no longer installed in a statically rigid manner in the space or at the floor, but is rather movable in space by a drive apparatus, in particular in dependence on the movements and/or deformation of the machine components determined by the movement determination module. If the movement determination module determines deflections of machine components such as of the crane tower due to adjustment movements or deformations that would have an effect on the position of the real crane operator's cab, the drive apparatus is correspondingly controlled by a drive control apparatus to simulate the movement of the crane operator's cab and to move the control station accordingly. If, for example, a command to rotate the crane about an upright axis is input at the control station, the control command is accordingly rotated about the upright axis by the drive apparatus. If, for example, the control command to lift a heavy load is input, which can in reality result in a slight pitching of the crane structure with a slight twisting of the tower, the control station is traveled a little to the front and/or is tilted a little to the front by the drive apparatus.

To enable a particularly realistic simulation of the control station movements occurring in real operation, the drive apparatus can be configured as movable in multiple axes and/or can perform both rotational and translational movements. The control station can in particular be movably supported in multiple axes and the drive apparatus can comprise at least one upright axis of rotation and at least one horizontal luffing axis and/or two horizontally aligned translation axes. To be able also to simulate complex control station movements, the drive apparatus can have three axes of rotation or of tilt or can be configured as working rotationally in three axes and as working translationally in three axes so that the control station can be rotated or tilted about all three spatial axes and can be translationally traveled in all three spatial directions. Depending on the crane type or machine type to be simulated, simpler configurations of the drive apparatus having fewer axes of movement can also be considered.

In accordance with a further aspect, the movement determination module can be configured such that the crane structure or machine structure is not considered as a rigid structure, so-to-say as an infinitely stiff structure, but rather as an elastically deformable and/or yielding and/or relatively soft structure that permits movements and/or position changes due to deformations of the structural components—in addition to the adjustment movement axes of the machine such as of the boom luffing axis or the tower slewing axis. The taking into account of the movability of the machine structure as a consequence of structural deformations under load or under dynamic loads is in particular of importance with elongated, slim, and deliberately maximized structures such as cranes with respect to the static and dynamic conditions—while taking account of the required safety properties—since here noticeable movement portions, for example for the crane operator's cab, but also the lifting hook position also occur due to the deformations of the structural elements. To be able to enable an actually realistic teaching or a realistic training here, the movement determination module takes account of such deformations of the machine structure under static or dynamic loads.

The determination device for determining such structural deformations can in particular comprise a calculation unit that calculates these structural deformations on the basis of a stored calculation model in dependence on the control commands entered at the control station. Such a model can have a similar structure to a finite element model or can be a finite element model, but with a model considerably simplified with respect to a fine element model advantageously being used.

The structural part deformations taken into account by the movement determination module can, on the one hand, be taken into account on the control of the drive apparatus for moving the control station so that the control station maps the control station movements occurring due to the structural part deformations. Alternatively or additionally, the determined structural part deformations can also be taken into account in the calculation of the virtual representation of the machine surroundings and/or of the machine components visible therein, for example such that the deflection of the boom is shown in the virtual representation or the horizon of the crane surroundings is traveled upwardly a little to map a slight frontward pitching of the crane operator's cab by a tower deformation, for example.

To further increase the feeling of reality of the user of the simulator, provision is made in accordance with a further aspect that the virtual representations of the simulator world provided by the graphical simulation module are superposed on the display apparatus with live images from the control station that can, for example, show movements of the remote control device user. The virtual representations generated by the graphical simulation module of the machine surroundings and/or of the machine components visible therein, on the one hand, and live images of a live camera recorded at the control stand, on the other hand, can in particular be shown simultaneously and superposed on the display apparatus. Such a superposition of images from the simulation world and live images gives the remote control device user a particularly strong feeling of realism.

A display apparatus wearable on the head, in particular in the form of eyeglasses, for example in the form of virtual reality glasses and a camera advantageously wearable on the head, for example designed as a helmet camera or integrated in said virtual reality glasses can advantageously be used as a display apparatus for this purpose that provides said live images that are shown together with the artificially generated virtual representation on the display apparatus, in particular on the virtual reality glasses. Simpler display devices, for example in the form of screens, can, however, also be used.

In a further development of the invention, said simulator can also be used as a remote control device for the remote control of a "real" crane or of a "real" construction machine, with a communication connection advantageously being able to be provided between the construction machine, on the one hand, and the simulator then forming a remote control device, on the other hand, via which the control commands input at the control station of the remote control device can be transmitted to the control device of the crane, of the construction machine and/or of the pallet truck. The "real" crane or the respective remote controlled "real" device performs the control commands input at the control station of the simulator or at the remote control device; the virtual representation of the machine surroundings and of the machine components visible therein generated at the control station simultaneously displays how the machine implements the control commands. Provision can be made here to feed the movement parameters and sensor signals detected at the real unit back to the remote control device and to use them there for the generation of the virtual representation of the machine surroundings to ensure that a representation corresponding to the actual machine surroundings and machine position is displayed on the display apparatus of the remote control device.

In accordance with a further aspect of the present invention, the control of a construction machine actually used on the construction site can also be linked to the structure data model or to the BIM model. It is in particular possible to intervene in the control of the construction machine with reference to digital information from the structure data model and/or to parameterize and/or modify the control of the construction machine.

Such an intervention in the construction machine control can, for example, comprise the adaptation of a working range boundary implemented there to structure data from the structure data model, with a temporally dynamic adaptation advantageously being able to take place such that the working range boundary can be adapted to resulting construction progresses or can be gradually changed.

Alternatively or additionally to such an automatic adaptation of the working range boundary, a construction progress monitoring can also be provided in which the actual state of the structure and/or its surroundings are detected by means of a suitable detection device such as a camera and/or a scanner and/or a flying object and is/are compared with digital information from the structure data model. For the detection of the actual state, structure contours can be detected and/or measured by a camera and/or existing construction elements can be read by means of a barcode scanner and/or can be detected by means of an RFID reader and/or position data of construction elements can be determined by means of a localizer, for example in the form of a GPS module or of a radar measurement module.

A determination as to the construction phase the structure is currently in can take place using the comparison of the detected actual data with the associated relevant BIM data. Different assisting and/or automated measures can then be initiated with reference to this determination of the current construction phase by a corresponding construction phase determination module. For example, which work steps are to be carried out next and/or where a construction element delivered to the delivery station is to be moved in accordance with its intended purpose can be displayed at a display apparatus of the construction machine. For example, a virtual representation of the structure in its respective state can be generated on a display unit in the operator's cab of the construction machine and/or in the control station of the remote control device with reference to imported information from the structure data model, in which virtual representation the construction element currently to be traveled or moved and its position is displayed so that, for example, a crane operator can see what lift is to be made and where a construction element to be suspended at the hook is to be moved.

In an advantageous further development of the invention, the control of the construction machine can also have a hoist control module provided for the automated hoist control with reference to relevant information from the structure data model. Said hoist control module can here work semi-automatically or fully automatically to carry out a lift in an automated manner in interaction with an input or release or with confirmation commands of the machine operator or optionally also without such complementary control commands. The machine operator can identify the construction element to be moved by the construction machine in a semi-automatic manner for this purpose. Alternatively, an automated construction element recognition can also take place, for example by means of a suitable detection device such as a barcode reader and/or an RFID code recognition device and/or a scanner and/or a camera in order, for example, to identify a load suspended at the crane hook of a crane. Alternatively or additionally to said RFID recognition, work can also be carried out with an LWID, i.e. in the identification system working in the low frequency or low wave range. Work can in particular also be carried out with a so-called RuBee recognition system, with such a RuBee system communicating bidirectionally on demand, with work being able to be carried out, for example, in a frequency range of an order of magnitude of 100-150 kHz, but optionally also higher up to 450 kHz. Such RuBee tags can comprise a microprocessor having a memory module and can use an IP address. The RuBee recognition can in particular also use magnetic waves and/or can communicate inductively, with the RuBee recognition in particular being characterized by its robustness with respect to interference due to metal parts and moisture and thus being particularly suitable for construction machine deployment or crane deployment.

It is then possible to determine for a detected and/or identified construction element with reference to the structure data model and to relevant digital information the location of the structure to which the construction element is to be moved, with in particular position data for the respective construction element from the structure data model being able to be used for this purpose.

The hoist control module can calculate the travel path for the automated hoist, optionally while taking account of further topographical data of the construction site such as access roads et cetera, from the data provided by the structure data model and relating to the identified construction element and optionally further structure characteristics such as structure contours.

Alternatively or additionally to such an automated traveling of the construction machine by said hoist control module, a blocking module can also be provided that can block a corresponding hoist or a corresponding work step of the construction machine in interaction with the structure data model, in particular, for example, when a corresponding construction element has been installed or when a connecting module required for the installation of the construction element has not yet been installed.

Said blocking module can in particular work in interaction with the aforesaid construction progress monitoring, in particular such that a determination is made with reference to the previously explained desired/actual comparison of the construction progress whether the structure is ready to move the respective construction element accordingly. Unnecessary lifts with construction elements can hereby be avoided that cannot yet be installed or whose installed position is not yet ready.

The blocking module and/or the aforesaid hoist control module can be integrated in the machine control apparatus and/or can be downloadable and/or importable as a software tool or can also be linked to the machine control apparatus in the form of a stored, separate module. The blocking module and/or the hoist control module can advantageously be parameterized and/or modified by means of digital information from the structure data model.

Figure 2:
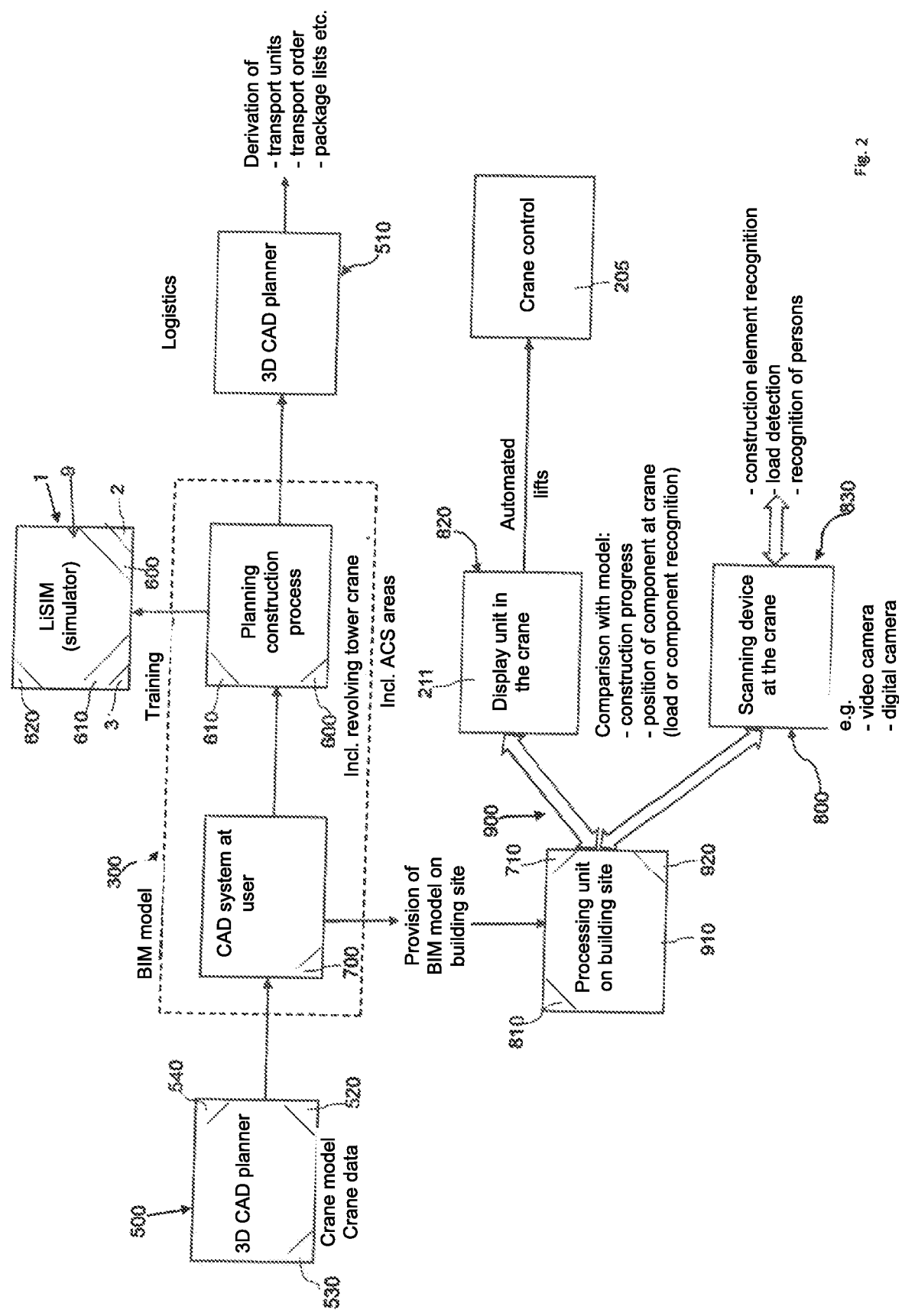

The invention will be explained in more detail in the following with respect to a preferred embodiment and to associated drawings. There are shown in the drawings:

FIG. 1: a schematic representation of a construction machine in the form of a crane whose control is linked to a structure data model and which maneuvers a load in a region that is not visible behind a building; and FIG. 2: a schematic diagram representation of the link of a structure data model to the control of the crane of FIG. 1 and to a machine data model to assist the construction planning and to a simulator to simulate the operation of the crane with the aid of data from the structure data model.

As FIG. 1 shows, a crane 200 that is linked in a manner still to be explained to a structure data model 300 can be configured as a revolving tower crane whose tower 202 supports a boom 203 at which a trolley 204 is travelably supported. The boom 203 can be rotated about an upright axis together with the tower 202 or also without the tower 202—depending on the configuration of the crane as a top slewer or as a bottom slewer—for which purpose a slewing gear drive is provided. The boom 203 could optionally also be configured as being able to be luffed up and down about a horizontal transverse axis, with a suitable luffing drive being able to be provided, for example, in interaction with the boom guying. Said trolley 204 can be traveled by means of a trolley travel winch or of a different trolley travel drive.

Instead of the crane 200 shown, however, a different crane could also be used, for example in the form of a telescopic boom crane or also a construction machine of a different type such as an excavator, and could be linked to the BIM or to the structure data model 300.

As FIG. 2 shows, the crane 200 can already be taken into account in the planning phase. For this purpose, a construction machine model 500 that can include in the said manner digital information on different construction machinery, in particular on different cranes, including the crane 200 of FIG. 1, can be linked to a structure data model 300. Said construction machine model 500 can be provided in the form of a downloadable software tool or software module that has an interface that permits the construction machine model 500 to be linked to the structure data model 300 so that the two can communicate and exchange data with one another.

The planning process can be simplified with the aid of the link of said machine data model 500. The selection of the crane, the positioning of the crane relative to the structure to be prepared, and the working ranges of the crane 200 can in particular be carried out or determined in the manner initially explained in more detail. For this purpose, suitable software modules and/or hardware modules, in particular a machine selection module 520, an installation location determination module 530, a collision determination module 700, and a working range setting module 710, can be integrated into the construction machine model 500 and/or into the structure data model 300.

As FIG. 2 shows, a logistics module 510 can be linked to the structure data model 300, with said logistics module 510 being integrated in the machine data model 500 and/or being downloadable in the form of a software module or also being able to be formed as separate module and advantageously comprising an interface adapted to the structure data model 300 so that the logistics module 510 and the structure data model 300 can communicate with one another and can exchange data.

In particular logistical functions relating to the selected construction machine can be carried out in an automated manner with the aid of said logistics module 510. Required transport units can in particular be determined for the transport of the construction machine, for example of the crane 200 of FIG. 1, and/or the order and times of the transport jobs of the transport units can be determined and/or so-called packing lists or transport lists can be prepared.

A simulator 1 can furthermore be linked to the structure data model 300 to generate the virtual reality provided by the simulator 1 with reference to digital information relating to the structure to be prepared and to be worked.

A control station 2 of the simulator 1 can here comprise in a manner known per se an operator's seat, for example in the form of an operator's chair, about which various input means for inputting control commands are arranged. Said input means can, for example, comprise a joystick, a touchscreen, control levers, input buttons and input switches, rotary regulators, sliding regulators, and similar.

The operator's position is here surrounded by an operator's station wall that can correspond to a cab housing and that can have window regions that are glazed in real crane operator's cabs, but are tinted in a certain color in the control station 2 of the simulator 1, coated with a green film, for example, to be able to impose virtual machine surroundings by means of green screen technology.

The control station 2 is advantageously installed on a movement platform by means of which the control station is movable in a multi-axial manner. The movement platform is here advantageously configured as movable in a multi-axial manner, in particular tiltable or rotatable about three spatial axis x, y, and z, and is translatorily displaceable along these axes.

Actuators of a drive apparatus, for example in the form of electric motors and/or hydraulic cylinders and/or hydraulic motors, are associated with the movement axes of the movement platform to be able to move the control station 2 about or along said axes.

The drive apparatus is here controlled by a movement control apparatus that can, for example, be implemented by an industrial PC.

Said movement control apparatus can here in particular be part of a movement determination module by means of which crane movements and/or positions and/or orientations of crane components such as of the boom or of the tower and also twisting phenomena of structural components such as of the boom or of the tower can be determined in dependence on the respective control commands input at the control station. Said movement determination module so-to-say determines the effects of the input control commands to the crane to be simulated, i.e. that would result in movements, positions, orientations, and twisting phenomena of the crane components as a consequence of input control commands at the crane to be simulated and outputs corresponding movement signals characterizing said parameters.

Said movement determination module does not determine said movement parameters or does not determine them completely by calculation using a computation model, but makes use of actual hardware components in the form of drive components and control components that perform actual movements and simulate the corresponding hardware components at a real crane.

Said simulator 1 is advantageously configured to simulate the operation of the respective selected construction machine on the basis of information provided from the structure data model 300, with a graphical simulation module 9 being provided to generate a virtual representation of the structure to be erected and/or to be worked on a display apparatus 3 of the control station 2 of the simulator 1 with the aid of the digital information from the structure data model.

The control of the simulator 1 can advantageously comprise a construction phase module 600 by means of which different pieces of digital information can be read out of the structure data model 300 or can be identified at different construction phases of the structure by means of which the display apparatus 3 of the simulator 1 can then display the structure in different construction phases so that a machine operator can train different special jobs such as special lifts in the different construction phases.

A job simulation module 610 can be provided for this purpose that is connected to the graphical simulation module 9 such that a virtual representation of the construction part to be worked and its movement path as well as how the construction part is to be moved can be superposed on the display apparatus 3 of the simulator in addition to the structure.

Without being shown explicitly in the drawing, two or more simulators 1 can also be linked to the structure data model and can generally each be configured in the aforesaid manner. A higher ranking simulator control apparatus 620 is advantageously provided here that coordinates the graphical simulation modules 9 of the plurality of simulators 1 with one another, in particular such that control commands and corresponding machine actions that are generated at the one simulator are also taken into account in the other simulator, in particular in the virtual representation displayed there, and optionally also in the generated dynamic reactions of the operator's seat such as has been previously explained.

Said simulator 1 can advantageously also be used as a remote control device by means of which the crane 200 shown in FIG. 1 can be remote controlled. The remote control device can here advantageously also be used for the remote control of a plurality of construction machines that can be installed on the same construction site or on different construction sites so that the remote control device so-to-say forms a control center.

Alternatively or additionally to such a virtual representation, however, a real camera generated representation of the crane surroundings and/or of the lifting hook can also be used at the control station 2. At least one camera whose live images are transmitted to the control station 2 can be installed at the crane 200 for this purpose. Such a camera 220 can, for example, be installed at the crane operator's cab 210 of the remote controlled crane 200 and can advantageously have at least approximately an axis of view that corresponds to the axis of view of a crane operator in the crane operator's cab 210 and/or that goes from the crane operator's cab 210 to the lifting hook.

Alternatively or additionally, however, different cameras and/or representations can be recorded from different perspectives and can be transmitted to the control station to be displayed there. An aerial drone can in particular be used that is equipped with at least one camera and that can be moved by remote control relative to the crane 200.

To be able to see the lifting hook 208 that can be connected to a hoist rope 207 running down from the trolley 204 or a load received thereat or the environment of the lifting hook 208 when the lifting hook 208 is outside the range of vision of the crane operator's cab 206 or of the crane operator, for example when—as FIG. 1 shows—the load is to be placed down behind a building, an aerial drone 209 is provided in accordance with the invention at which at least one camera 210 is installed by means of which a camera image of the lifting hook 208 and/or of the lifting hook environment can be provided. Said camera image is advantageously a live image or a real time image in the sense of a television image or video image and is wirelessly transmitted from the camera 210 of the aerial drone 209 to a display unit 211 and/or to the control apparatus 205 of the crane 201, with said display unit 211, for example, being able to be a machine operator display in the manner of a tablet or of a screen or of a monitor that can be installed in the crane operator's cab 206. If a remote control station or a mobile operating unit is used to control the crane 200 in the previously named manner, said display unit 211 can be provided in the remote control station or at the mobile operating unit.

The aerial drone 209 is provided with a remote control device 212 that permits the aerial drone 209 to be remote controlled, in particular the flight control units such as rotor blades to be controlled to remote control the flight position of the aerial drone 209 and/or to remote control the camera 210, in particular with respect to the panning angle or the viewing axis of the camera 210 relative to the body of the aerial drone 209 and/or the focal length of the camera 210.

A corresponding remote control module can be provided in the crane operator's cab 206 and/or in the remote control station or in the mobile operating unit and can, for example, be equipped with corresponding joysticks. To enable a simple operation however, a voice control and/or a menu control can also be provided for the aerial drone 209, for example to select a desired relative position from a plurality of predefined relative positions of the aerial drone 209 relative to the crane. This can be done, for example, in that "drone position 1" is input by voice control and/or by menu control that can be stored in a preprogrammed or predetermined manner in the position control apparatus 213.

As FIG. 2 shows, the crane 200 can also be linked to the structure data model 300. To provide the BIM or the structure data model 300 on the construction site, a construction site computer 901 can be provided that can be positioned in the region of the structure to be erected. Long data distances and a time delay can hereby be reduced and an interaction between the structure data model 300 and the crane 200 can be implemented free of or low in time delay.

Different crane functions or generally control functions of the corresponding construction machine can be adapted or parameterized in dependence on digital data from the structure data model 300 due to the link of the crane 200 to the structure data model 300. Corresponding digital information from the structure data model 300 can be sent to the crane 200 for this purpose by means of the data communication device 900 shown in FIG. 2. Said data communication device 900 in particular connects the construction site computer 910 to the control apparatus 205 of the crane 200.

A control configuration module 902 that can be implemented in the control apparatus 205 of the crane 200, but that can also be provided in the construction site computer 910, is provided to correspondingly adapt said control functions to the control apparatus 205 of the crane 200. This control configuration module 920 can in particular adapt the working range boundary function of the crane 200, that can be implemented in its control apparatus 205, to different construction phases, and accordingly to growing structure walls and obstacles by means of digital data from the structure data model 300.

Independently of such an adaptation of the working range boundary, the link to the structure data model 300 can also be used to implement an automated construction phase monitoring. For this purpose, on the one hand, the actual state of the structure can be determined by means of a suitable detection device 800, with said detection device 800 generally being able to be configured differently. The detection device 800 can, for example, comprise at least one camera and/or a suitable imaging sensor, for example in the form of the camera 210 installed at the aerial drone 209 or of a camera 220 installed at the crane 200. An image processing device arranged downstream of the generated images can detect specific characteristics, for example structure height, developed ground plan surface, outline contours or similar, that characterize the construction progress. Alternatively or additionally to such cameras or imaging sensors, other detection means can also be provided such as a scanner or an RFID reader to detect whether certain construction elements are already installed at the structure or not. Such a scanner or RFID reader can, for example, be attached to the crane hook 208 or can also be used in the form of a mobile unit by means of which installed components can be manually scanned.

The actual state of the structure detected by the detection device 800 is then compared with digital information from the structure data model 300 by a construction phase determination module 810 that can, for example, be implemented in the construction site computer 910 to determine the respective construction phase from the comparison.

The crane 200 can carry out different functions on the basis of the determined construction phase. It is, for example, already helpful if he respective reached construction phase is displayed on a display apparatus at the crane 200, either in its crane operator's cab 206 or at the control station 2 of the remote control device.

However, further control functions can also be adapted at the crane 200 with the aid of a control configuration module 920 that can be implemented in the construction site computer 910, but in particular also in the control apparatus 205 of the crane 200. For example, a virtual representation of the respective work job to be carried out next by the construction machine can be displayed at said display unit at the crane or at its remote control apparatus, for example such that the respective next construction element to be installed and its installed position at the structure are superposed in the virtual representation of the structure in its respective construction phase. Alternatively or additionally, a travel path can also be superposed in the representation.

In an even more advantageous manner, automated lifts can also be carried out by the crane 200, in particular on the basis of the aforesaid construction phase monitoring and the accompanying determination of the next work step. For this purpose, a detection device 830 can be provided by means of which a construction element located in the pick-up region or working range of the crane 200 can be detected, in particular as to whether it is the construction element that should be installed in the next work step. Said detection apparatus 830 can, for example, comprise a barcode scanner or an RFID reader that can be attached to the crane hook. It is, however, understood that different detection means can also be used to identify the construction element to be picked up.

If it is found in this manner that the construction element to be installed in the next work step has been suspended at the crane hook 208, said control configuration module 920 can cause the crane control apparatus 205 to carry out an automated lift on the basis of the digital information from the structure data model 300 to move the component to the installed location in accordance with its intended purpose.

As FIG. 2 indicates, other recognition functions, for example a person recognition, can also be implemented by means of suitable scanning units or detection apparatus, in particular as to whether persons are in the load travel path of the automated lift or whether persons are located at the crane in an unauthorized manner, et cetera.

The invention claimed is:

1. A method of planning and controlling the operation of a construction machine comprising:

automatically selecting by means of a machine selection module a construction machine suitable for the erection and/or working of a structure with reference to a structure data model that includes digital information on the structure, wherein the automatic selection by means of the machine selection module comprises:

providing a machine data model that includes digital information on different construction machine models;

automatically identifying relevant information from the structure data model with reference to criteria that are specified by the machine data model and relate to machine data in which the different construction machine models differ;

automatically comparing the identified relevant information from the structure data model with the machine data in which the different construction machine models differ from the machine data model; and automatically selecting the construction machine suitable for the erection and/or working of the structure with reference to the comparison;

wherein the selected construction machine comprises:
a construction machine control apparatus for controlling the selected construction machine;
a data communication device for receiving and processing digital information on the structure from the structure data model;
a control configuration module for influencing at least one control function of the selected construction machine control in dependence on the received digital information on the structure from the structure data model; and
a working range boundary setting module; and automatically determining by means of an installation location determination module an installation location of the selected construction machine relative to the structure to be erected and/or to be worked, using both digital information retrieved from the structure data model and digital information retrieved from the machine data model, wherein the automatic determination by means of the installation location determination module comprises:

automatically identifying relevant information from the structure data model, wherein at least two pieces of the identified relevant information from the structure data model are structure dimensions and structure contours;

automatically identifying relevant information from the machine data model, wherein at least a piece of the identified relevant information from the machine data model is a working range of the selected construction machine;

automatically comparing with a collision determination module the determined installation location and the retrieved working range of the selected construction machine with the retrieved structure dimensions and structure contours of the structure data model for a collision check, checking a sufficient range and/or possible collisions;

adapting a working range boundary function carried out by the construction machine control apparatus by the working range boundary setting module on the basis of the comparing with the collision determination module in order to automatically restrict the working range of the selected construction machine with reference to the collision check; and updating the structure data model using the automatically restricted working range of the selected construction machine.

2. The method in accordance with claim 1, wherein at least another piece of the identified relevant information read from the structure data model is selected from the group consisting of structure height, weight of the heaviest construction element to be moved, area of the structure in elevation, cross-sectional extent of the structure in elevation, and maximum distance between a construction element delivery station and a construction element destination; and wherein at least another piece of machine data from the machine data model is selected from the group consisting of machine lifting height, maximum hoist weight, and machine range.

3. The method in accordance with claim 1 further comprising:

checking a specific installation position location of the selected construction machine relative to the structure to be erected and/or to be worked using digital information from the structure data model, wherein the checking comprises:

automatically identifying relevant information from the structure data model, wherein at least two pieces of the identified relevant information from the structure data model are structure dimensions and structure contours;

automatically identifying relevant information from the machine data model, wherein at least a piece of the identified relevant information from the machine data model is the working range of the selected construction machine; and automatically comparing the working range of the selected construction machine with structure dimensions and contours for a collision check, checking a sufficient range and/or possible collisions.

4. The method in accordance with claim 3, wherein the working range of the selected construction machine is automatically restricted with reference to the collision check and the structure data model is updated using the automatically restricted working range.

5. The method in accordance with claim 1, wherein the order and/or the times of a delivery of parts of the selected construction machine is/are automatically fixed with reference to the structure data model by a logistics module communicating with the structure data model.

6. The method in accordance with claim 5, wherein transport units required for the delivery of the parts of the selected construction machine are automatically determined by the logistics module with reference to the structure data model.

7. The method in accordance with claim 1 further comprising:

providing digital information from the structure data model to a simulator for simulating the operation of the selected construction machine on the basis of the information provided; and generating a virtual representation of the structure to be erected and/or to be worked on a display apparatus of a control station of the simulator with the aid of the provided digital information from the structure data model.

8. The method in accordance with claim 7, wherein digital information on different construction phases of the structure to be erected and/or to be worked is accessed from the structure data model by a construction phase selection module and a virtual representation of the structure in different construction phases is represented on the display apparatus of the simulator.

9. The method in accordance with claim 7, wherein digital information relating to the working and/or moving of a construction element is read out of the structure data model by a job simulation module and a virtual representation of the construction element to be worked and/or of the movement path of the construction element to be worked relative to the structure is represented on the display apparatus of the simulator.

10. The method in accordance with claim 1, wherein digital information from the structure data model is provided to a plurality of simulators; and
   wherein a respective virtual representation of the structure to be erected and/or to be worked is generated by graphical simulation modules of the plurality of simulators on the basis of the information provided from the structure data model and is displayed on display apparatus of the simulators.

11. The method in accordance with claim 10, wherein the plurality of simulators are controlled in coordination with one another by a higher ranking simulator control apparatus; and
   wherein the graphical simulation modules of the plurality of simulators are controlled in dependence on control commands that are input at a respective other simulator such that the virtual representation is generated at a simulator, also in dependence on construction machine operating procedures that are simulated at a different simulator.

12. The method in accordance with claim 1, wherein the working range boundary function is automatically updated and adapted in dependence on construction progress at the structure to be erected and/or to be worked while taking account of digital information from the structure data model.

13. The method in accordance with claim 1, wherein machine data of the selected construction machine that characterize its installation location and/or working range are compared by the collision determination module with structure data from the structure data model that characterize structure contours and/or topographic surrounding contours; and
   wherein the working range boundary function is adapted by the working range boundary setting module on the basis of the comparison.

14. The method in accordance with claim 1, wherein an actual state of the structure is detected by means of at least one detection device;
   wherein the detected actual state of the structure is compared with digital information from the structure data model by a construction progress determination module; and
   wherein digital information from the structure data model determined in dependence on the comparison is provided to the construction machine control apparatus.

15. The method in accordance with claim 14, wherein a virtual representation of the structure in accordance with the detected actual state and/or a virtual representation of a next work job to be carried out by the selected construction machine is presented on a display apparatus that is arranged at the selected construction machine or at a control station remotely controlling the selected construction machine in dependence on the determined digital information from the structure data model that is provided to the selected construction machine in dependence on construction progress.

16. The method in accordance with claim 15, wherein a virtual representation of a next construction element to be worked and of an installation location of the next construction element at the structure in dependence on the detected actual state is generated in dependence on digital information from the structure data model.

17. The method in accordance with claim 1, wherein a construction element located in a pick-up region and/or working range of the selected construction machine is automatically detected by means of a detection apparatus;
   wherein digital information relating to the working of the detected construction element is provided from the structure data model in dependence on the detected construction element; and
   wherein a working step relating to the detected construction element is automatically carried out by the construction machine control apparatus on the basis of the digital information provided by the structure data model.

18. The method in accordance with claim 15, wherein the digital information from the structure data model provides position data that indicates the destination of a construction element and/or travel path data that indicates the travel path of the construction element; and
   wherein the construction element is automatically lifted and/or traveled by the construction machine control apparatus in dependence on the position data and/or travel path data.

19. An apparatus for planning and controlling the operation of a construction machine using a structure data model that includes digital information on a structure to be erected and/or to be worked comprising:
   a machine selection module for the automatic selection of a construction machine suitable for the erection and/or working of the structure with reference to the structure data model;
   a machine data model that includes digital information on different construction machine models;
   a first data selection module for automatically identifying relevant information from the structure data model with reference to criteria that are specified by the machine data model and relate to machine data in which the different construction machine models differ;
   a comparison module for automatically comparing the identified relevant information from the structure data model with the machine data in which the different construction machine models differ from the machine data model;
   wherein the machine selection module is configured for the automatic selection of the construction machine suitable for the erection and/or working of the structure of the comparison;
   an installation location determination module for the automatic determination of an installation location of the selected construction machine relative to the structure to be erected and/or to be worked, with reference to both digital information retrieved from the structure data model and digital information retrieved from the machine data model;
   a second data selection module for automatically identifying and reading relevant information from the structure data model, wherein at least two pieces of the identified relevant information from the structure data model are structure dimensions and structure contours;
   a third data selection module for automatically identifying and reading relevant information from the machine data model, wherein at least a piece of the identified relevant information from the machine data model is a working range of the selected construction machine;
   a first collision determination module for automatically comparing the determined installation location and the retrieved working range of the selected construction machine with the retrieved structure dimensions and structure contours of the structure data model for a collision check, checking a sufficient range and/or possible collisions; and a first working range boundary setting module for:
adapting a working range boundary function carried out by a construction machine control apparatus for controlling the selected construction machine on the basis of the comparing with the first collision determination module in order to automatically restrict the working range of the selected construction machine with reference to the collision check; and
updated the structure data model by the automatically restricted working range of the selected construction machine; and wherein the selected construction machine further comprises:
a data communication device for receiving and processing digital information on the structure from the structure data model; and
a control configuration module for influencing at least one control function of the selected construction machine control in dependence on the received digital information on the structure from the structure data model.

20. The apparatus in accordance with claim 19, wherein at least another piece of the identified relevant information read out of the structure data model by the first data selection module is selected from the group consisting of structure height, weight of the heaviest construction element to be moved, area of the structure in elevation, cross-sectional extent of the structure in elevation, and maximum distance between a construction element delivery station and a construction element destination; and
wherein at least another piece of machine data from the machine data model is selected from the group consisting of machine lift height, maximum machine payload, and machine range.

21. The apparatus in accordance with claim 19 further comprising:
a second installation location determination module for checking a specific installation location of the selected construction machine relative to the structure to be erected and/or to be worked, with reference to digital information retrieved from the structure data model;
a fourth data selection module for automatically identifying and reading relevant information from the structure data model, wherein at least one piece of the identified relevant information from the structure data model is structure contours;
a fifth data selection module for automatically identifying and reading relevant information from the machine data model, wherein at least a piece of the identified relevant information from the machine data model is the working range of the selected construction machine; and
a second collision determination module for automatically comparing the working range of the selected construction machine with structure contours of the structure data model for a collision check, checking a sufficient range and/or possible collisions.

22. The apparatus in accordance with claim 21, wherein a second working range boundary setting module is provided for determining a working range boundary of the selected construction machine with reference to the collision check and for updating the structure data model by the determined working range boundary.

23. The apparatus in accordance with claim 19 further comprising a logistics module for determining the order and/or the times of a delivery of parts of the selected construction machine with reference to digital information on the structure data model.

24. The apparatus in accordance with claim 23, wherein the logistics module is configured to automatically determine transport units required for the delivery of the parts of the selected construction machine with reference to the structure data model.

25. The apparatus in accordance with claim 19 further comprising:
a simulator for simulating the operation of the selected construction machine on the basis of information provided from the structure data model, with the simulator having an interface for communicating with the structure data model; and
a graphical simulation module for generating a virtual representation of the structure to be erected and/or to be worked on a display apparatus of a control station of the simulator with the aid of the provided digital information from the structure data model.

26. The apparatus in accordance with claim 25 further comprising a construction phase selection module for selecting digital information on different construction phases of the structure to be erected and/or to be worked from the structure data model;
wherein the construction phase selection module is connected to the graphical simulation module such that a virtual representation of the structure can be displayed in different construction phases on the display apparatus of the simulator.

27. The apparatus in accordance with claim 25 further comprising a job simulation module for reading digital information relating to the working and/or moving of a construction element from the structure data model;
wherein the job simulation module is connected to the graphical simulation module such that a virtual representation of the construction element to be worked and/or of the movement path of the construction element to be worked relative to the structure is represented on the display apparatus of the simulator.

28. The apparatus in accordance with claim 25 further comprising a plurality of simulators linked to the structure data model; and
wherein a respective virtual representation of the structure to be erected and/or to be worked is generated by graphical simulation modules of the plurality of simulators on the basis of the information provided from the structure data model and is displayed on display apparatus of the simulators.

29. The apparatus in accordance with claim 28, wherein the plurality of simulators are controlled in coordination with one another by a higher ranking simulator control apparatus; and
wherein the graphical simulation modules of the plurality of simulators are controlled in dependence control commands that are input at a respective other simulator such that the virtual representation is generated at a simulator, also in dependence on construction machine operating procedures that are simulated at a different simulator.

30. The apparatus in accordance with claim 19 further comprising:
at least one detection device for detecting an actual state of the structure; and
a construction phase determination module for comparing the detected actual state of the structure with digital information from the structure data model and for determining the construction phase in dependence on the comparison;

wherein the data communication device is configured to provide digital information from the structure data model to the selected construction machine configured to provide specific digital information from the structure data model to the construction machine control apparatus in dependence on the determined construction phase.

31. The apparatus in accordance with claim 30, wherein the control configuration module is configured to display a virtual representation of the structure in accordance with the detected actual state and/or a virtual representation of a next work job to be carried out by the selected construction machine on a display apparatus that is arranged at the selected construction machine or at a control station remotely controlling the selected construction machine in dependence on the specific digital information from the structure data model that is provided to the selected construction machine in dependence on construction progress.

32. The apparatus in accordance with claim 31, wherein the control configuration module is further configured to display a virtual representation of the next construction element to be worked and of the installed location of the construction element at the structure in dependence on the detected actual state of the structure.

33. The apparatus in accordance with claim 30, wherein at least one of the detection devices is installed on a remote-controlled aerial drone.

34. The apparatus in accordance with claim 19 further comprising a detection apparatus for detecting a construction element located in a pick-up region and/or the working range of the selected construction machine;

wherein the data communication device configured to provide digital information relating to the working of the detected construction element in dependence on the detected construction element from the structure data model to the construction machine control apparatus; and wherein the control configuration module configured to automatically carry out a working step relating to the detected construction element on the basis of the digital information provided by the structure data model.

35. The apparatus in accordance with claim 34, wherein the digital information from the structure data model comprise position data that indicate the destination of the detected construction element and/or travel path data that indicate the travel path of the detected construction element; and wherein the control configuration module is further configured to raise and/or to travel the selected construction machine automatically in dependence on the position data and/or travel path data.

36. The apparatus in accordance with claim 34, wherein the detection apparatus comprises one or more of a camera, an imaging sensor, a barcode scanner, and an RFID reader.

37. The apparatus in accordance with claim 19, wherein the data communication device comprises a construction site computer that is provided on the construction site and that is communication ally connected to the selected construction machine.

38. A construction machine comprising:
a construction machine control apparatus for controlling the construction machine;
a data communication device for receiving and processing digital information on a structure from a structure data model;
a control configuration module for influencing at least one control function of the construction machine control in dependence on the received digital information on the structure from the structure data model; and
a working range boundary setting module;
wherein the construction machine is suitable for the erection and/or working of the structure with reference to the structure data model that includes digital information on the structure; and
wherein the construction machine is configured to automatically determine an installation location relative to the structure to be erected and/or to be worked, using both digital information retrieved from the structure data model and digital information retrieved from a machine data model, wherein the automatic determination comprises:
automatically identifying relevant information from the structure data model, wherein at least two pieces of the identified relevant information from the structure data model are structure dimensions and structure contours;
automatically identifying relevant information from the machine data model, wherein at least a piece of the identified relevant information from the machine data model is a working range of the construction machine;
automatically comparing the determined installation location and the retrieved working range of the construction machine with the retrieved structure dimensions and structure contours of the structure data model for a collision check, checking a sufficient range and/or possible collisions;
adapting a working range boundary function carried out by the construction machine control apparatus by the working range boundary setting module on the basis of the comparing in order to automatically restrict the working range of the construction machine with reference to the collision check; and
updating the structure data model using the automatically restricted working range of the construction machine.

39. The construction machine in accordance with claim 38, wherein the control configuration module is configured to one or more of:
change the working range boundary function taken into account by the construction machine control apparatus in dependence on digital information from the structure data model;
display a virtual representation of the structure in accordance with an actual state and/or a virtual representation of a next work job to be carried out by the construction machine on a display apparatus that is arranged at the construction machine or at a control station remotely controlling the construction machine in dependence on digital information from the structure data model in dependence on a determined construction phase; and
display a virtual representation of a next construction element to be worked and the installed location of the construction element at the structure in dependence on digital data from the structure data model.

40. The construction machine in accordance with claim 38 further comprising a detection apparatus for detecting a construction element located in a pick-up region and/or the working range of the construction machine;
wherein the data communication device is configured to provide digital information relating to the working of the detected construction element in dependence on the detected construction element from the structure data model to the construction machine control apparatus; and
wherein the control configuration module is configured to automatically carry out a working step relating to the detected construction element on the basis of the digital information provided by the structure data model.

41. The construction machine in accordance with claim 40, wherein the digital information from the structure data model comprises position data that indicates the destination of the construction element and/or travel path data that indicate the travel path of the construction element; and
wherein the control configuration module is further configured to raise and/or to travel the construction machine automatically in dependence on the position data and/or travel path data.

42. The construction machine in accordance with claim 40, wherein the detection apparatus comprises one or more of a camera, an imaging sensor, a barcode scanner, and an RFID reader.

43. A simulator for simulating the operation of the construction machine of claim 38 on the basis of information provided from the structure data model, the simulator comprising:
an interface for communicating with the structure data model;
a graphical simulation module for generating a virtual representation of the structure to be erected and/or worked;
a display apparatus for displaying the virtual representation;
a control station having input means for inputting control commands for the construction machine;
a simulator data communication device for receiving and processing digital information from a structure data model; and
a simulator control configuration module for influencing at least one control function of the simulator in dependence on the digital information received from the structure data model.

44. The simulator in accordance with claim 43 further comprising a construction phase selection module for selecting digital information on different construction phases of the structure to be erected and/or to be worked from the structure data model, the construction phase selection module connected to the graphical simulation module such that a virtual representation of the structure can be displayed in different construction phases on the display apparatus of the simulator.

45. The simulator in accordance with claim 43 further comprising a job simulation module for reading digital information relating to the working and/or moving of a construction element from the structure data model, the job simulation module connected to the graphical simulation module such that a virtual representation of the construction element to be worked and/or of the movement path of the construction element to be worked relative to the structure is represented on the display apparatus of the simulator.

46. A remote-control device for the construction machine of claim 38 comprising:
a control station that has at least one input means for inputting control commands;
a signal transmission device for transmitting the input control commands to the construction machine control apparatus;
a display apparatus for displaying a representation of a piece of working equipment and/or of the construction machine surroundings;
a remote-control device data communication device for receiving and processing digital information from the structure data mode; and
a remote-control device control configuration module for influencing at least one control function of the construction machine control device in dependence on the digital information received from the structure data model.

47. A non-transitory computer-readable medium having stored thereon computer-readable instructions executable to cause a computer to perform a method of selecting the construction machine of claim 38 from among a group of different construction machines the method comprising:
providing the machine data model that includes digital information on different construction machine models representative of the group of different construction machines;
automatically identifying relevant information from the structure data model with reference to criteria that are specified by the machine data model and relate to machine data in which the different construction machine models differ;
automatically comparing the read information from the structure data model with the machine data of the group of different construction machines from the machine data model; and
selecting the construction machine, being suitable for the erection and/or working of the structure, with reference to the comparison.

48. The computer-readable medium in accordance with claim 47, wherein the information read out of the structure data model by the data selection program means comprises at least one of the following pieces of information:
structure height, weight of the heaviest construction element to be moved, area and/or cross-sectional extent of the structure in elevation, and maximum distance between a construction element delivery station and a construction element destination; and
wherein the machine data from the machine data model compared with the at least one piece of information read out of the structure data model include at least one of the following pieces of information: machine lift height, maximum machine payload, and machine range.

49. The computer-readable medium in accordance with claim 47, wherein the method further comprises determining with an installation location determination program means the installation location.

50. The computer-readable medium in accordance with claim 49, wherein the method further comprises setting, with a working range boundary setting program means, the working range of the construction machine with reference to the collision check and for updating the structure data model using the automatically restricted working range of the construction machine.

51. The computer-readable medium in accordance with claim 47, wherein the method further comprises determining, with a logistics program means, the order and/or the times of the delivery of parts of the construction machine with reference to digital information on the structure data model.

52. The computer-readable medium in accordance with claim 51, wherein the logistics program means further automatically determines transport units required for the delivery of the parts of the construction machine with reference to the structure data model.

* * * * *